United States Patent [19]
Ramirez

[11] Patent Number: 5,514,987
[45] Date of Patent: May 7, 1996

[54] DIGITAL REGENERATIVE COMPARATOR

[75] Inventor: Sergio R. Ramirez, Austin, Tex.

[73] Assignee: Advanced Micro Devices Inc., Sunnyvale, Calif.

[21] Appl. No.: 265,930

[22] Filed: Jun. 27, 1994

[51] Int. Cl.⁶ .................................................. H03K 5/153
[52] U.S. Cl. .......................... 327/74; 327/206; 327/217
[58] Field of Search ................................ 327/52, 53, 54, 327/55, 56, 57, 65, 66, 67, 205, 217, 560, 561, 563, 68, 72, 76, 74, 206

[56] References Cited

U.S. PATENT DOCUMENTS

| 4,408,132 | 10/1983 | Kuwahara | 327/205 |
| 4,786,825 | 11/1988 | O'Shaughnessy et al. | 327/206 |
| 4,977,336 | 12/1990 | Martiny | 327/205 |
| 5,170,076 | 12/1992 | Smith | 327/74 |
| 5,200,654 | 4/1993 | Archer | 327/66 |

FOREIGN PATENT DOCUMENTS 55-97727  7/1980  Japan ..................................... 327/205

OTHER PUBLICATIONS

"Halbleiter–Schaltungstechnik", 1991, 9th edition, Springer Verlag, Berlin, pp. 177 & 185.

Primary Examiner—Timothy P. Callahan
Assistant Examiner—My-Trang Nu Ton
Attorney, Agent, or Firm—Foley & Lardner

[57] ABSTRACT

A regenerative comparator provides the capability of operating faster than a traditional regenerative comparator and the hysteresis points can be individually set and fine tuned. The regenerative comparator includes a current mirror having an input transistor connected to first and second output transistors, a first and second reference current sources which are set at a first and second predetermined level, respectively. An outputs of the first and second output transistors are provided to the latch through an inverter. The output of the latch transitions from a first logical output state to a second logical output state when an input current increases from a magnitude less than the first predetermined level to a magnitude greater than the first predetermined level.

6 Claims, 3 Drawing Sheets

DIGITAL REGENERATIVE COMPARATOR

BACKGROUND OF THE INVENTION

Regenerative comparators, also known as Schmitt trigger circuits, have existed since 1938, when first implemented using tubes. The primary feature of a regenerative comparator is its ability to generate a clean rectangular pulse when supplied with a sine, saw tooth, or poorly-shaped rectangular pulse. The regenerative comparator is therefor, often used to clean up digital waveforms that have been corrupted by noise.

Another advantage of regenerative comparators is hysteresis. This allows the output to transition from a LOW level to a HIGH level when the input voltage reaches a first value and then transition back to the LOW level from the HIGH level when the input voltage reaches a second value.

Convention regenerative comparators are constructed from analog circuitry using a positive analog feedback loop. An example of a conventional regenerative comparator is shown in FIG. 1. Input voltage 22 is supplied to the positive input 30 of comparator 20. Negative input 32 of comparator 20 can be connected to either VREF1 on signal line 24 or VREF2 on signal line 26. Analog switch 28 determines whether negative input 32 is connected to signal line 24 or signal line 26. VREF1 and VREF2 are voltage levels where, in this example, VREF1 is greater than VREF2. Traditionally, VREF1 and VREF2 are related to each other in that they are both a function of a common voltage, such as a supply voltage. Output 34 of comparator 20 is fed back to analog switch 28 over line 36. When output 34 is LOW, for example 0 volts, analog switch 28 connects negative input 32 to signal line 24 and thus VREF1. When output voltage 34 is HIGH, for example 5 volts, analog switch 28 connects negative input 32 to signal line 26 and thus VREF2.

Thus, the circuit of FIG. 1 requires feedback to accomplish hysteresis. It is therefore not easy to fine tune the levels at which state changes are made, due to the feedback nature of the device. Also, since they are related, the hysteresis levels cannot be independently adjusted.

SUMMARY OF THE INVENTION

One object of the present invention is to incorporate digital circuitry into a regenerative comparator to overcome the aforementioned disadvantages.

The regenerative comparator of the present invention overcomes the aforementioned disadvantages by avoiding the use of an analog feedback loop or analog switches. As a result, the regenerative comparator of the present invention has the capability of operating faster than a conventional analog regenerative comparator. Moreover, the regenerative comparator of the present invention can have its changing states fine-tuned. In addition, the hysteresis levels of the regenerative comparator of the present invention can be independently adjusted.

The aforementioned advantages are achievable by a circuit according to the invention utilizing two comparators and logic to process the outputs of the two comparators. These and other objects of the invention are accomplished by providing, in a first embodiment of the present invention, a regenerative comparator comprising a first comparator, a second comparator, and an input voltage line connected in parallel to each of the first and second comparators. The input voltage line provides an input voltage signal to each of the first and second comparators. A first reference voltage line is connected to the first comparator to provide a first reference voltage signal having a first predetermined value. A second reference voltage line is connected to the second comparator to provide a second reference voltage signal having a second predetermined value. A latch has an output, a SET input connected to an output of the first comparator and a RESET input connected to an output of the second comparator, wherein the output of the latch transitions from a LOW level to a HIGH level when the input voltage signal increases from a magnitude less than the first predetermined value to a magnitude greater than the first predetermined value.

An alternative embodiment of the present invention provides a regenerative comparator comprising a current mirror having an input transistor connected to first and second output transistors, the input transistor being connected to an input current, the first output transistor being connected to a first node, the second output transistor being connected to a second node. A first reference current source is connected between the first node and ground, the first reference current source being set at a first predetermined level. A second reference current source is connected between the second node and ground, the second reference current source being set at a second predetermined level. A latch has an output, a SET input connected to the first node and a RESET input connected to an output of an inverter, an input of the inverter being connected to the second node, wherein the output of the latch transitions from a LOW level to a HIGH level when the input current increases from a magnitude less than the first predetermined level to a magnitude greater than the first predetermined level.

Still another embodiment of the present invention provides for a regenerative comparator comprising a first comparator connected to a first reference signal and an input signal, the first comparator outputting a first output signal at a first logic level when the input signal is greater than the first reference signal; a second comparator connected to a second reference signal and the input signal, the second comparator outputting a second output signal at the first logic level when the input signal is less than the second reference signal; and an output circuit connected to the first and second comparators, the output circuit outputting a regenerated signal according to the first and second output signals from the first and second comparators.

Yet another embodiment of the present invention provides for a method of regenerating an input signal in a regenerative comparator containing a first comparator, a second comparator and a latch, the method including the steps of: simultaneously comparing the input signal to a first reference signal as a first comparison in the first comparator and comparing the input signal to a second reference signal as a second comparison in the second comparator; supplying the results of the first and second comparisons to inputs of the latch; and outputting a regenerated signal according to the results of the first and second comparisons.

BRIEF DESCRIPTION OF THE DRAWINGS

The above and other features of the present invention will be apparent from a view of the drawings wherein.

DETAILED DESCRIPTION OF THE PREFERRED EMBODIMENTS

Figure 2:
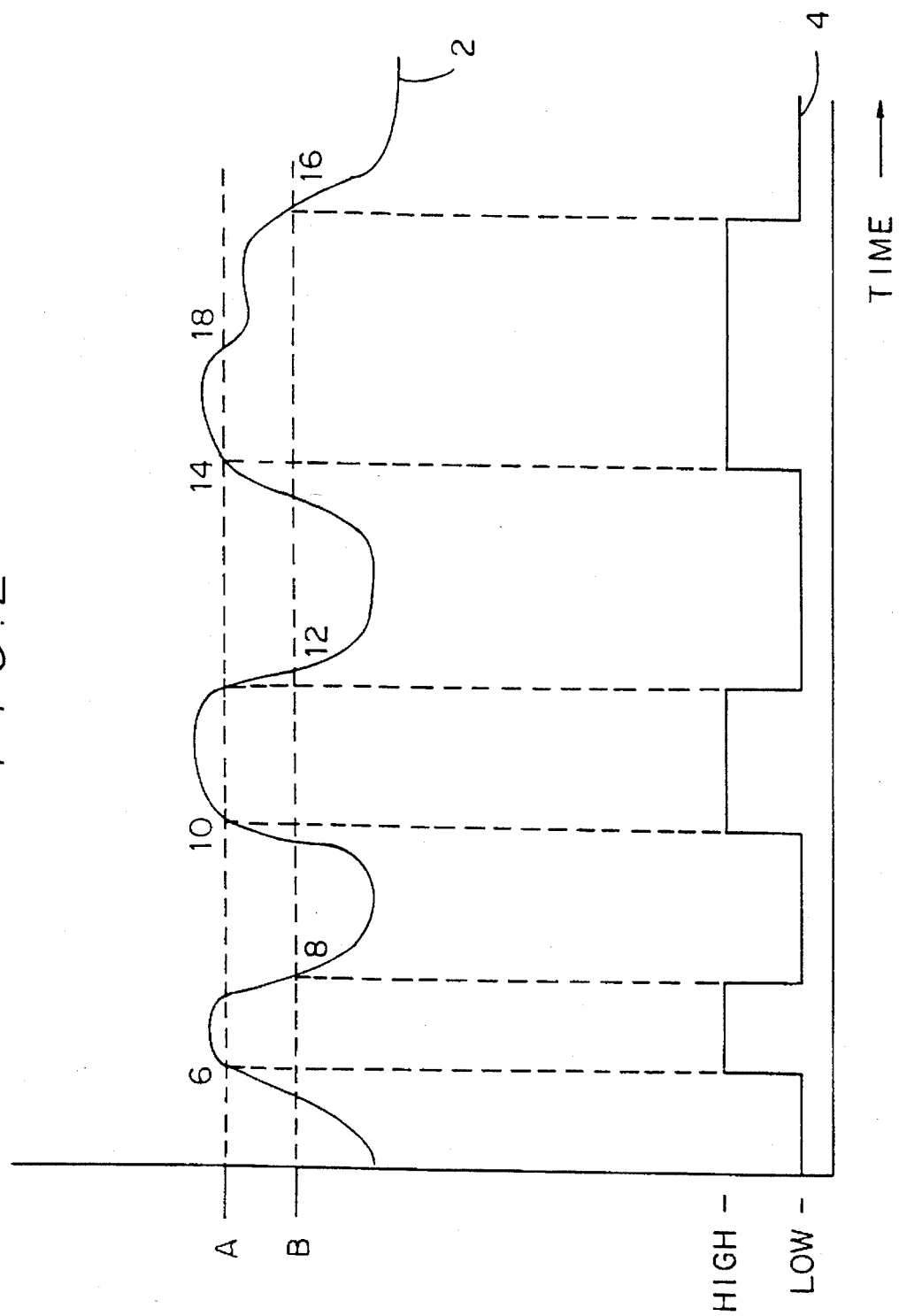
FIG. 2 displays input/output characteristics of regenerative comparators.

FIG. 2 shows an example of the input/output relationship of a regenerative comparator. In FIG. 2, input voltage 2 varies with time. As can be seen in the figure, when input voltage 2 reaches level A, output 4 transitions from a LOW state to a HIGH state. Output 4 will remain in this HIGH state until input voltage 2 reaches level B. Thus, transitions are made from the LOW state to the HIGH state at points 6, 10 and 14, while transitions are made from the HIGH state to the LOW state at points 8, 12 and 16. An example of the hysteresis feature of the regenerative comparator can be seen by noticing that when input voltage 2 falls to level A, for example at point 18, the output voltage does not transition to the LOW state. Instead, output signal 4 remains at the HIGH state until input voltage 2 falls to level B at point 16, at which time output signal 4 will transition to the LOW state. Thus, the regenerative comparator creates a well defined output signal from a poorly shaped or noise-corrupted input signal.

Figure 1:
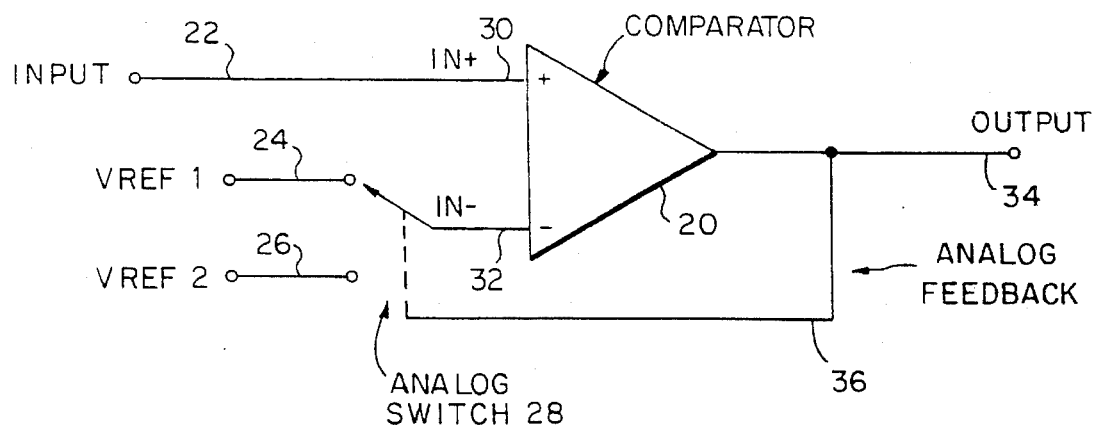
FIG. 1 displays an analog regenerative comparator of the prior art.
Figure 3:
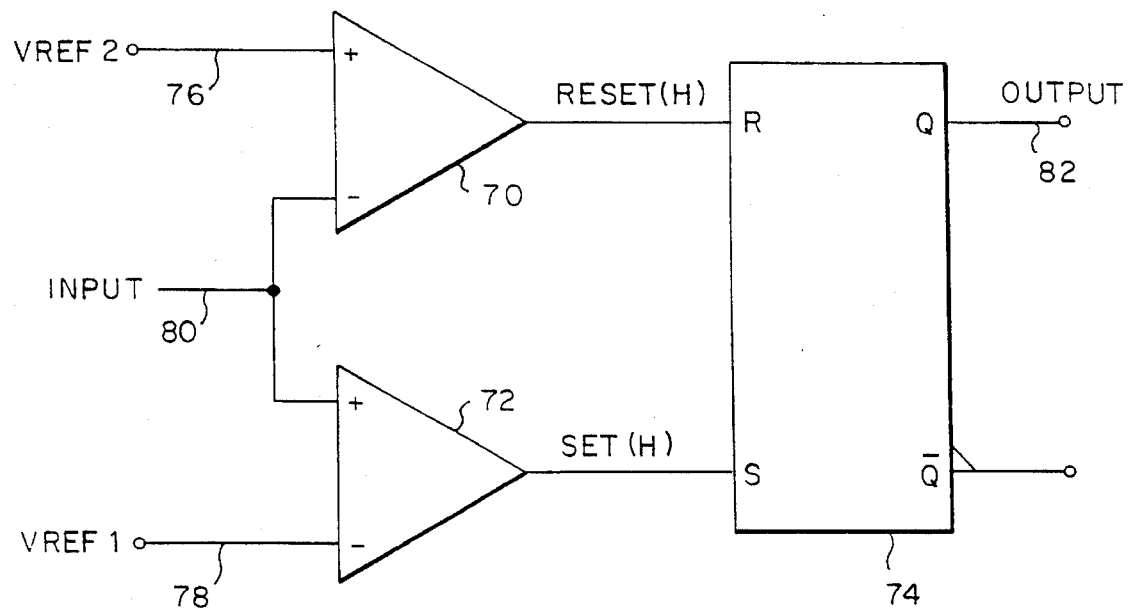
FIG. 3 displays an embodiment of a regenerative comparator of the present invention.

FIG. 3 displays an embodiment of the regenerative comparator of the present invention combining analog and digital circuitry capable of producing the same results as the regenerative comparator of FIG. 1 without the disadvantages inherent in the analog feedback and switching features present in the arrangement of FIG. 1.

The circuit of FIG. 3 employs two comparators 70 and 72 and RS latch 74. The input voltage is connected via signal line 80 to the negative input of comparator 70 and the positive input of comparator 72. VREF2 is connected via signal line 76 to the positive input of comparator 70, while VREF1 is connected via signal line 78 to the negative input of comparator 72. The output of comparator 72 is connected to the SET input of latch 74, while the output of comparator 70 is connected to the RESET input of latch 74. The SET and RESET terminals of latch 74 are assumed to be active high for this description. The output of the circuit is provided by the Q-output of latch 74, while an inverted output can also be provided from the $\overline{Q}$ output of latch 74.

Figure 4:
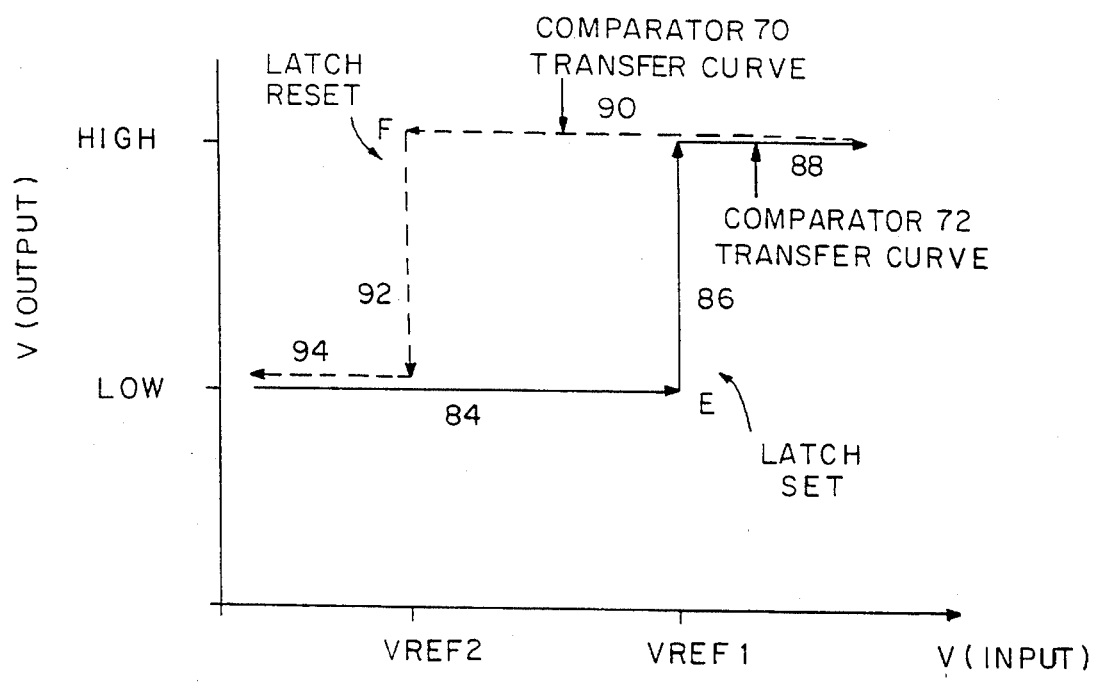
FIG. 4 displays the input/output characteristics of the regenerative comparator of FIG. 3.

The input/output characteristics of the present invention can be seen with reference to FIG. 4, while continuing to refer to FIG. 3. Initially, assume that latch 74 is in the RESET state with the $\overline{Q}$ output at a logical low on signal line 82 and that the input voltage is less than VREF2. Assuming the input voltage is increasing, the input is somewhere on the left portion of vector 84. Since the input is less than VREF2, comparator 70 will continuously output logical HIGH signals to the RESET input of latch 74. As the input voltage continues to increase, it eventually becomes greater than VREF2. This causes comparator 70 to stop sending logical HIGH signals to the RESET input of latch 74. However, due to the nature of latches, the lack of a RESET signal has no affect on output 82 of latch 74. Thus, as the input voltage passes VREF2, the output voltage remains in a logical LOW state.

Eventually, the input voltage will reach the level of VREF1. At this point, designated E in FIG. 4, the voltage on the positive input of comparator 72 meets and then exceeds the voltage on the negative input of comparator 72. Thus, comparator 72 transmits a logical HIGH signal to the SET input of latch 74. Latch 74 then sets and output voltage 82 transitions from the LOW state to the HIGH state, as shown by vector 86 of FIG. 4.

As the input voltage continues to increase along vector 88, it does not change the $\overline{Q}$ output voltage on signal line 82 even though comparator 72 continues to output a logical HIGH signal to the SET input of latch 74. This is due to the nature of latches, as is known in the art. As the input voltage falls along vector 90, it eventually reaches a level below VREF1. When the input voltage is less than VREF1, comparator 72 has a negative input which exceeds its positive input and therefore causes comparator 72 to transmit logical LOW signals to the SET input of latch 74. The LOW signals on the SET input will have no affect on output voltage 82 due to the nature of latches.

When the input voltage falls to the level of VREF2, as designated by point F of FIG. 4, comparator 70 has a positive input in excess of its negative input and transmits a HIGH signal to the RESET input of latch 74, causing output 82 to fall to a logical LOW level as shown by vector 92 of FIG. 4. While the input voltage continues to decrease along vector 94, comparator 70 will continue to assert the RESET input of latch 74. Of course, since latch 74 is already in a RESET state, these signals will not change output 82. Therefore, it can be seen that output 82 will continue to remain in the logical LOW state until latch 74 is again set when the input voltage reaches the level of VREF1, causing comparator 72 to once again transmit a logical HIGH signal to the SET input. As described above, a circuit according to the invention provides a simplified manner for achieving the results of a conventional regenerative comparator.

Further, the simplicity of the present invention provides many advantages. Firstly, since no analog switches are incorporated in the circuit, it can operate at a faster rate than a conventional regenerative comparator. Secondly, comparators 70 and 72 can each be independently fine-tuned. Thus, unlike the conventional regenerative comparator, hysteresis levels VREF1 and VREF2 are not interdependent. Thus, these levels are independently adjustable in a way not available in conventional regenerative comparators.

Figure 5:
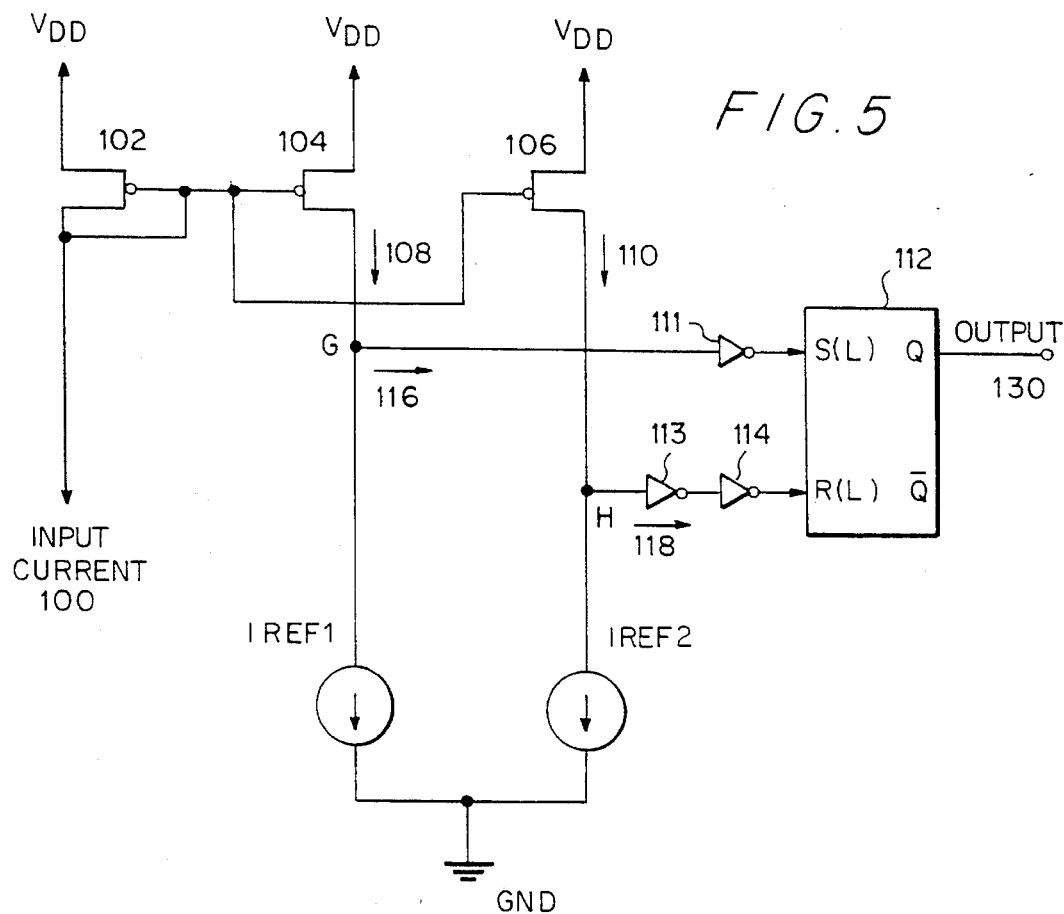
FIG. 5 displays another embodiment of the regenerative comparator of the present invention.

FIG. 5 illustrates another embodiment according to the invention. This embodiment, according to the invention, operates in the current mode. Transistor 102 is connected to both transistor 104 and transistor 106 in a current mirror fashion. Thus, input current 100 is replicated by currents 108 and 110 flowing into nodes G and H respectively. IREF1 and IREF2 provide reference levels in manner similar to VREF1 and VREF2 in the example of FIG. 3.

For purposes of illustration, assume that IREF1 is greater than IREF2. Latch 112, an active low latch in this example, has its SET input connected to node G and its RESET input connected through inverter 114 to node H. Inverting buffers 111 and 113 are optionally provided on the SET and RESET lines respectively. Of course, if buffers 111 and 113 are not used, latch 112 can then be active high in order for the circuit to operate appropriately.

Currents 116 and 118 are respectively drawn flowing from nodes G and H in the direction of the SET and RESET inputs of latch 112. In operation, however, current does not flow into or out of the SET and RESET inputs of latch 112 due to the nature of latches, as known in the art. However, to describe the operation of the circuit, it is illustrative to have the current flow shown along the directions designated by 116 and 118.

At node G, transistor 104 attempts to force current 108, equal to input current 100, into the node. At the same time, the current source labelled IREF1 attempts to force current equivalent to IREF1 out of node G. Since current 116 is always equal to zero, a mismatch occurs whenever current 108 (and hence input current 100) does not equal IREF1. The relative magnitudes of currents 108 and IREF1 then determine the logic state of node G as follows.

When current 108 is less than the value of IREF1, IREF1 attempts to draw current 116 towards node G in order to satisfy Kirchoff's law that the sum of currents into and out of a node equals zero. However, since current 116 is always zero, the voltage at node G will be driven to its lowest level, which is zero, corresponding to a logic LOW level. In the embodiment of FIG. 5, buffer 111 inverts the LOW level to a HIGH level which is supplied to the active low SET input of latch 112. Thus, when current 108, and hence input current 100, is less than IREF1, latch 112 does not receive a SET input.

Alternatively, the identical function results if latch 112 is active high and buffer 111 is not employed. In this case, the LOW level at node G is connected directly to the active high SET input of latch 112, such that latch 112 again does not receive a SET input.

When current 108, and hence input current 100, is greater than IREF1, the opposite result occurs. The circuit attempts to drive current 116 towards the SET input of latch 112. Since in operation current 116 equals zero, the voltage at node G is driven to its highest level, corresponding to a HIGH logic level of, for example, 5 volts. As can be seen in FIG. 5, buffer 111 inverts the HIGH level of node G to a LOW level at the SET input of latch 112. Thus, when current 108, and hence current 100, exceeds IREF1, latch 112 receives a SET input.

Similarly, node H is HIGH when current 110 is greater than IREF2 and LOW when current 110 is less than IREF2. In the configuration according to the invention in FIG. 5, a HIGH at node H translates into a HIGH at the reset input of latch 112 due to the operation of inverting buffer 118 and inverter 114. Thus, latch 112 does not receive a RESET input when current 110, and hence input current 100, is greater than IREF2. However, when node H is LOW, as a result of current 110 being less than IREF2, a corresponding LOW input at the RESET input of latch 112 occurs. Thus, latch 112 receives a RESET input when current 110, and hence input current 100, is less than IREF2.

Assuming input current 100 is less than IREF2 (and therefore less than IREF1 since IREF1 is greater than IREF2), the resulting LOW signal on the RESET input of latch 112 will cause latch 112 to be in the reset state.

As the input current increases, it will eventually reach the level of IREF2. At this point, node H will become HIGH, thus causing a HIGH level at the RESET input of latch 112. The change from the LOW logic level to the HIGH logic level will have no effect on output 130 of latch 112, since latch 112 is already in the reset state. Thus, while in the reset state, the level on the RESET input of latch 112 is immaterial, as is known in the art.

Eventually, however, input current 100 will reach a point exceeding IREF1. At this point, node G becomes HIGH. This will cause the logic state at the SET input of latch 112 to be LOW, causing latch 112 to set.

It can be seen, in a manner similar to that described above regarding the voltage mode of FIG. 3, that latch 112 will remain SET as long as input current 100 remains at a level greater than IREF2. If input current 100 falls below the level of IREF1, but is still above the level of IREF2, latch 112 will remain in the SET state even though the logic state on the SET input changes. Thus, hysteresis is provided wherein the latch is SET when the input current reaches a higher level (IREF1) and is not RESET until the input current reaches a lower level (IREF2).

The aforementioned embodiments of the present invention are provided merely by way of example. Alternative configurations can be constructed which remain within the spirit of this invention. For example, latches other than RS latches can be used. Moreover, either level triggered or edge triggered latches can be employed. Also, alterative logic circuits achieving analogous results can be incorporated. Thus, although this invention has been disclosed and illustrated with reference to particular embodiments, the principles involved are susceptible for use in numerous other embodiments which will be apparent to persons skilled in the art. The invention, is, therefore, to be limited only as indicated by the scope of the appended claims, to include all changes which come within the meaning and the range of equivalency of the claims.

What is claimed is:

1. A regenerative comparator comprising:

a current mirror having an input transistor connected to first and second output transistors, the input transistor being connected to an input current, the first output transistor being connected to a first node, the second output transistor being connected to a second node;

a first reference current source connected to the first node, the first reference current source being set at a first predetermined level;

a second reference current source connected to the second node, the second reference current source being set at a second predetermined level;

a latch having an output, a first input connected to the first node and a second input connected to an output of an inverter, an input of the inverter being connected to the second node; and wherein the output of the latch transitions from a first logical output state to a second logical output state when the input current increases from a magnitude less than the first predetermined level to a magnitude greater than the first predetermined level.

2. The regenerative comparator of claim 1, wherein the output of the latch transitions from the second logical output state to the first logical output state when the input current decreases from a magnitude greater than the second predetermined level to a magnitude less than the second predetermined level.

3. The regenerative comparator of claim 1, wherein the first logical output state is a LOW state and the second logical output state is a HIGH state.

4. The regenerative comparator of claim 1, wherein the first logical output state is a HIGH state and the second logical output state is a LOW state.

5. The regenerative comparator of claim 1, wherein the first input is a SET input of an R-S flip-flop and the second input is a RESET input of the R-S flip-flop.

6. A regenerative comparator comprising:

a current mirror having an input transistor connected to first and second output transistors, the input transistor being connected to an input current, the first output transistor being connected to a first node, the second output transistor being connected to a second node;

a first reference current source connected between the first node and ground, the first reference current source being set at a first predetermined level;

a second reference current source connected between the second node and the ground, the second reference current source being set at a second predetermined level;

a latch having an output, a SET input connected to the first node and a RESET input connected to an output Of an inverter, an input of the inverter being connected to the second node;

wherein the output of the latch transitions from a LOW level to a HIGH level when the input current increases from a magnitude less than the first predetermined level to a magnitude greater than the first predetermined level.

* * * * *